US008981863B2

United States Patent
Shin et al.

(10) Patent No.: US 8,981,863 B2
(45) Date of Patent: Mar. 17, 2015

(54) MODULATION APPARATUS FOR CLASS D SWITCHING AMPLIFIER

(75) Inventors: Jea Young Shin, Yongin-si (KR); Soo Hyoung Lee, Hwaseong-si (KR)

(73) Assignee: Cesign Co., Ltd. (KR)

( * ) Notice: Subject to any disclaimer, the term of this patent is extended or adjusted under 35 U.S.C. 154(b) by 0 days.

(21) Appl. No.: 14/125,400

(22) PCT Filed: Aug. 18, 2011

(86) PCT No.: PCT/KR2011/006073
§ 371 (c)(1),
(2), (4) Date: Dec. 11, 2013

(87) PCT Pub. No.: WO2013/018950
PCT Pub. Date: Feb. 7, 2013

(65) Prior Publication Data
US 2014/0312985 A1    Oct. 23, 2014

(30) Foreign Application Priority Data

Aug. 4, 2011 (KR) .......................... 10-2011-0077870

(51) Int. Cl.
*H03K 7/08* (2006.01)
*H03F 3/217* (2006.01)

(52) U.S. Cl.
CPC .................. *H03K 7/08* (2013.01); *H03F 3/217* (2013.01); *H03F 2200/351* (2013.01)
USPC ........................................... 332/109; 330/10

(58) Field of Classification Search
USPC ................ 332/109, 110; 330/10, 251, 207 A; 375/238
See application file for complete search history.

(56) References Cited

U.S. PATENT DOCUMENTS

| | | | |
|---|---|---|---|
| 4,968,948 A * | 11/1990 | Tokumo et al. | .................. 330/10 |
| 6,498,530 B1 | 12/2002 | Tang | |
| 7,078,964 B2 * | 7/2006 | Risbo et al. | ...................... 330/10 |
| 7,230,485 B2 | 6/2007 | De Cremoux et al. | |
| 7,965,214 B2 * | 6/2011 | Khoury et al. | ................ 341/152 |

(Continued)

FOREIGN PATENT DOCUMENTS

| | | |
|---|---|---|
| JP | 2005502253 | 1/2005 |
| JP | 2006520159 | 8/2006 |
| JP | 2008048305 | 2/2008 |
| KR | 1020080078936 | 8/2008 |

(Continued)

OTHER PUBLICATIONS

International Search Report—PCT/KR2011/006073 dated Aug. 14, 2012.

*Primary Examiner* — Joseph Chang
(74) *Attorney, Agent, or Firm* — Cantor Colburn LLP

(57) ABSTRACT

A modulation apparatus for a class D switching amplifier is capable of reducing power consumption of an Electro-Migration Interface (EMI) of an output end and a gate driver end in a zero input signal. The modulation apparatus for a class D switching amplifier includes a control unit for detecting and outputting a control signal which is a common signal component of a first modulation signal modulated by using a first input signal and a second modulation signal modulated by using a second input signal; and is characterized by feedback of a first output signal, a second output signal and a common output signal outputted by using the first modulation signal, the second modulation signal and the control signal through an input of the modulation apparatus.

7 Claims, 5 Drawing Sheets

(56) References Cited

U.S. PATENT DOCUMENTS

2008/0030267 A1* 2/2008 Yang ............................ 330/10
2009/0160553 A1* 6/2009 Wei et al. ..................... 330/251

FOREIGN PATENT DOCUMENTS

| WO | 03021771 | 3/2003 |
| WO | 2008105592 | 9/2008 |

* cited by examiner

MODULATION APPARATUS FOR CLASS D SWITCHING AMPLIFIER

FIELD OF THE INVENTION

The present invention relates, in general, to a modulation apparatus and, more particularly, to a modulation apparatus for a class D switching amplifier, which can reduce an Electro-Migration Interface (EMI) occurring at output terminals and power consumption occurring in gate driver stages, with respect to zero input signals.

DESCRIPTION OF THE PRIOR ART

A class D amplifier is advantageous in that it uses a Pulse Width Modulation (PWM) scheme, has efficiency higher than that of a class B amplifier, and minimizes power loss because transistors are operated only in a switching mode.

The configuration diagram of a conventional modulation apparatus 100 for a typical 3-state class D switching amplifier is illustrated in FIG. 1. For zero input signals, the modulation apparatus 100 of FIG. 1 generates the same PWM signals having a duty cycle of 50% as the output signals thereof, as shown in FIG. 2. These PWM signals cause an Electro-Migration Interface (EMI) on the lines of output terminals, and dynamic current is consumed due to the switching of gate drivers.

In this case, power consumption may be represented by the following Equation 1:

$$Pavg = VDD \times Iavg$$
$$= \frac{Ctot \times VDD^2}{T}$$
$$= Ctot \times VDD^2 \times f_{pwm}$$

Equation 1 where Ctot denotes the capacitance of a total load capacitor seen from the gate driver stages, VDD denotes a supply voltage, and $f_{pwm}$ denotes the frequency of PWM signals at the output terminals.

Class D switching amplifiers have been widely used as power amplifiers for audio, and essentially require the elimination of the above-described EMI and power loss for zero input signals when the current situation, in which audio is essential for most of small-sized devices including mobile phones, is taken into consideration.

SUMMARY OF THE INVENTION

The present invention has been made keeping in mind the above problems occurring in the prior art, and an object of the present invention is to provide a modulation apparatus for a class D switching amplifier which can reduce an Electro-Migration Interface (EMI) occurring at output terminals and power consumption occurring in gate driver stages, with respect to zero input signals.

A modulation apparatus for a class D switching amplifier according to a preferred embodiment of the present invention includes a first modulation part for modulating a first input signal and outputting a first modulated signal; a second modulation part for modulating a second input signal and outputting a second modulated signal; and a control part for detecting and outputting a control signal that is a common signal component of the first modulated signal and the second modulated signal, wherein the control part further outputs a first difference signal that is a difference signal between the first modulated signal and the control signal; and a second difference signal that is a difference signal between the second modulated signal and the control signal.

In detail, the first modulation part may include a first integrator for receiving the first input signal, receiving some or all of one or more output signals via feedback, and integrating the received signals; and a first comparator for comparing an output signal of the first integrator with a reference signal and outputting the first modulated signal, and the second modulation part may include a second integrator for receiving the second input signal, receiving some or all of the one or more output signals via feedback, and integrating the received signals; and a second comparator for comparing an output signal of the second integrator with the reference signal and outputting the second modulated signal.

In addition, the modulation apparatus for the class D switching amplifier according to the preferred embodiment of the present invention may further include a power stage part for buffering and amplifying the first difference signal and the second difference signal and outputting a first output signal and a second output signal; and a delay cell part for buffering the control signal and outputting a common output signal.

Further, the first output signal and the common output signal may be fed back to input of the first modulation part, and the second output signal and the common output signal may be fed back to input of the second modulation part.

In accordance with a modulation apparatus for a class D switching amplifier according to the preferred embodiment of the present invention, there can be provided a modulation apparatus for a class D switching amplifier, which can reduce an Electro-Migration Interface (EMI) occurring at output terminals and power consumption occurring in gate driver stages, with respect to zero input signals.

Figure 1:
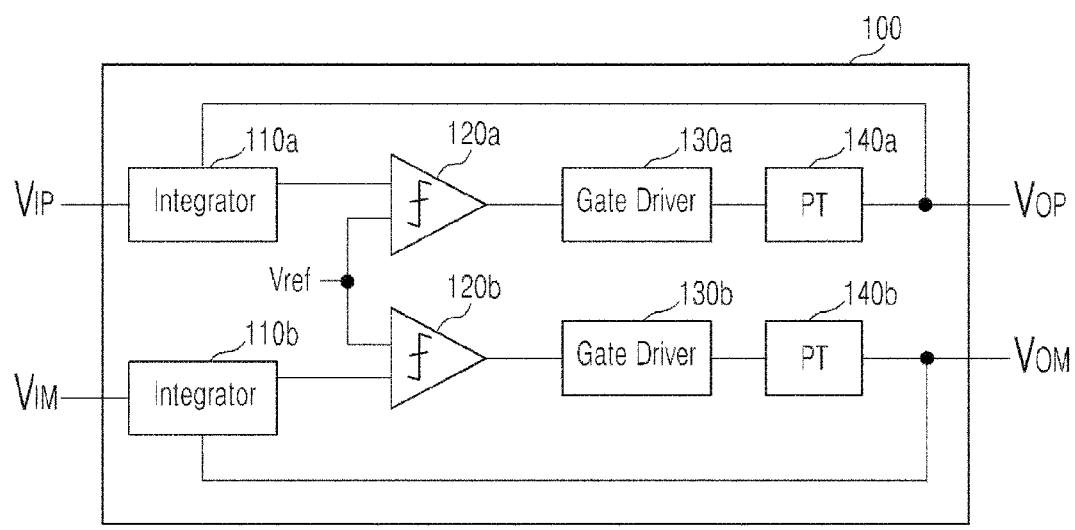
FIG. 1 is a configuration diagram showing a conventional modulation apparatus for a 3-state class D switching amplifier.
Figure 2:
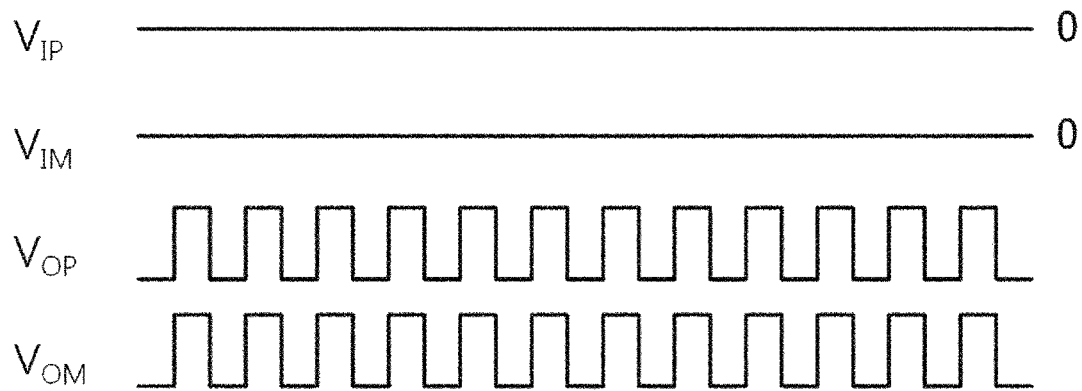
FIG. 2 is a waveform diagram showing output signals with respect to zero input signals of the conventional modulation apparatus.

| <Description of the Principal Parts in the Drawings> | |
|---|---|
| 100: conventional modulation apparatus for class D switching amplifier | |
| 110a, 110b: integrator | 120a, 120b: comparator |
| 130a, 130b: gate driver | 140a, 140b: power stage |
| 200: modulation apparatus for class D switching amplifier according to the present invention | |
| 210a: first modulation part | 210b: second modulation part |
| 220: control part | 230a, 230b: power stage part |
| 240: delay cell part | |
| 211a: first integrator | 211b: second integrator |
| 212a: first comparator | 212b: second comparator |
| 231a: first gate driver | 231b: second gate driver |
| 232a: first power transistor | 232b: second power transistor |

DETAILED DESCRIPTION OF THE EXEMPLARY EMBODIMENTS

Hereinafter, a modulation apparatus for a class D switching amplifier according to an embodiment of the present invention will be described in detail with reference to the attached drawings.

It is apparent that the following embodiment is merely intended to embody the present invention and is not intended to limit or restrict the scope of the present invention. Details that can be easily inferred by those skilled in the art to which the present invention pertains, from the detailed description and the embodiment of the present invention, should be interpreted as being included in the spirit and scope of the present invention.

Figure 3:
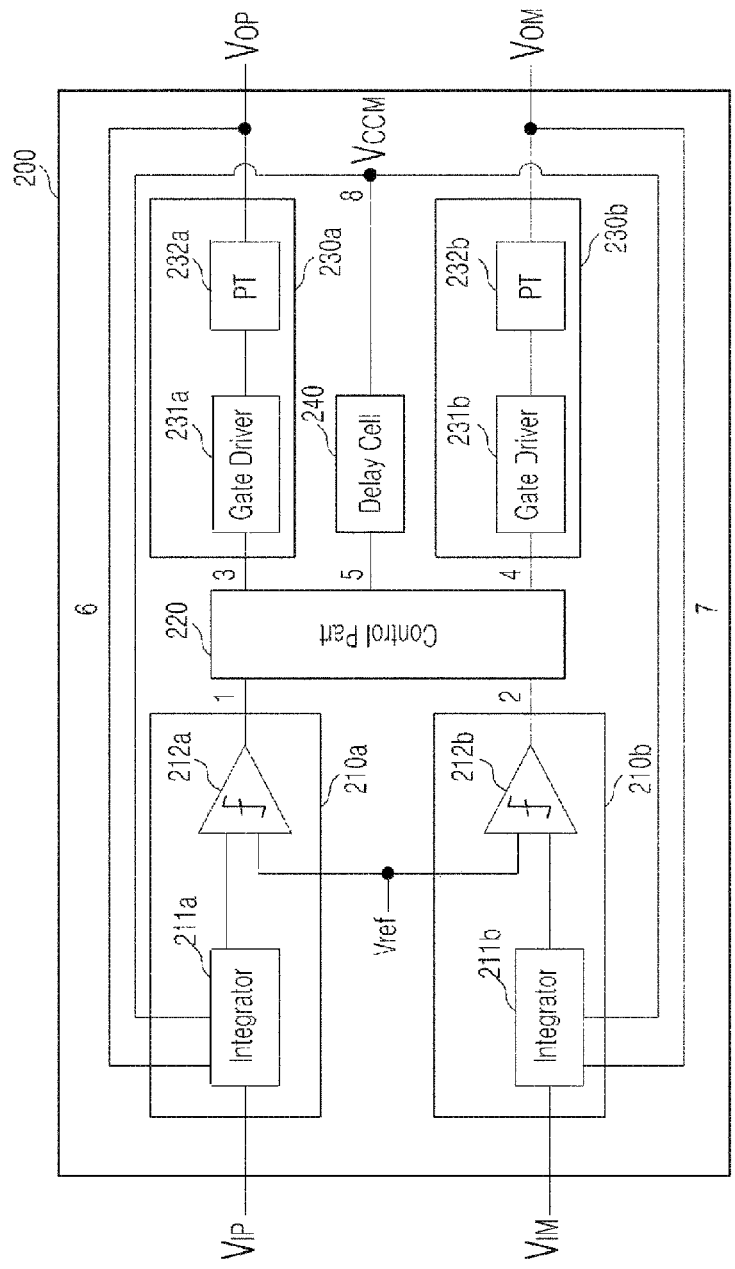
FIG. 3 is a diagram showing a modulation apparatus for a class D switching amplifier according to a preferred embodiment of the present invention.

First, FIG. 3 is a configuration diagram showing a modulation apparatus 200 for a class D switching amplifier according to a preferred embodiment of the present invention.

As can be seen in FIG. 3, the modulation apparatus 200 according to the embodiment of the present invention includes a first modulation part 210a for modulating a first input signal and outputting a first modulated signal, a second modulation part 210b for modulating a second input signal and outputting a second modulated signal, and a control part 220 for detecting a control signal that is a common signal component from the first modulated signal and the second modulated signal and outputting the control signal. In detail, the first input signal and the second input signal may preferably be differential input signals. In addition, the control part 220 further outputs a first difference signal that is a difference signal between the first modulated signal and the control signal and a second difference signal that is a difference signal between the second modulated signal and the control signal.

In detail, the modulation apparatus 200 according to the embodiment of the present invention preferably further includes power stage parts 230a and 230b for buffering and amplifying the first difference signal and the second difference signal, respectively, and outputting a first output signal and a second output signal, respectively, and a delay cell part 240 for buffering the control signal and outputting a common output signal.

In greater detail, the configuration of the power stage parts 230a and 230b will be described below. The power stage part 230a according to the embodiment of the present invention includes a first gate driver 231a for buffering the first difference signal and a first power transistor 232a for amplifying the buffered signal, and the power stage part 230b includes a second gate driver 231b for buffering the second difference signal and a second power transistor 232b for amplifying the buffered signal.

In detail, the first modulation part 210a preferably includes a first integrator 211a for receiving the first input signal, receiving some or all of one or more output signals via feedback, and integrating the received signals, and a first comparator 212a for comparing the output signal of the first integrator 211a with a reference signal Vref and outputting the first modulated signal. Similarly, the second modulation part 210b preferably includes a second integrator 211b for receiving the second input signal, receiving some or all of one or more output signals via feedback, and integrating the received signals, and a second comparator 212b for comparing the output signal of the second integrator 211b with the reference signal and outputting the second modulated signal. Here, the reference signal denotes a signal that is prepared for comparison with the respective output signals of the first integrator 211a and the second integrator 211b and that is to be input to the other one of two input terminals of each of the first comparator 212a and the second comparator 212b.

Further, it can be seen in FIG. 3 that some or all of one or more output signals fed back to the input of the first integrator 211a are signals generated based on the first modulated signal and the control signal, that is, the first output signal and the common output signal, and some or all of one or more output signals fed back to the input of the second integrator 211b are signals generated based on the second modulated signal and the control signal, that is, the second output signal and the common output signal.

Again, the configuration of the modulation apparatus 200 for the class D switching amplifier according to the embodiment of the present invention is summarized in brief as follows. The control part 220 which is the characteristic component of the present invention outputs the control signal that is a common signal component of the first modulated signal modulated using the first input signal and the second modulated signal modulated using the second input signal, the first difference signal that is a difference signal between the first modulated signal and the control signal, and the second difference signal that is a difference signal between the second modulated signal and the control signal. By adjusting suitable signal levels and timing using the first modulated signal, the second modulated signal, and the control signal in the control part 220, and inputting the adjusted signals to the modulation apparatus 200 of the present invention via feedback, when both the first input signal and the second input signal are zero input signals, the first output signal and the second output signal that are final output signals are output as zero output signals, thus solving the problem of EMI and power consumption.

Relations between the individual components shown in the configuration diagram of FIG. 3 will be described in detail again below.

First, when it is assumed that the first modulated signal that is the output signal of the first comparator 212a and the second modulated signal that is the output signal of the second comparator 212b are $V_{COP1}$ and $V_{COM1}$, respectively, and the control signal detected by the control part 220 is $V_{GDCOM}$, $V_{GDCOM}$, a first difference signal $V_{GDOP}$, a second difference signal $V_{GDOM}$, and the control signal $V_{GDCOM}$ may be represented by the following Equation 2:

$$V_{GDOP} = V_{COP1} - V_{GDCOM}$$

$$V_{GDOM} = V_{COM1} - V_{GDCOM}$$

$$V_{GDCOM} = V_{COP1} \cap V_{COM1} \qquad \text{Equation 2}$$

Figure 4:
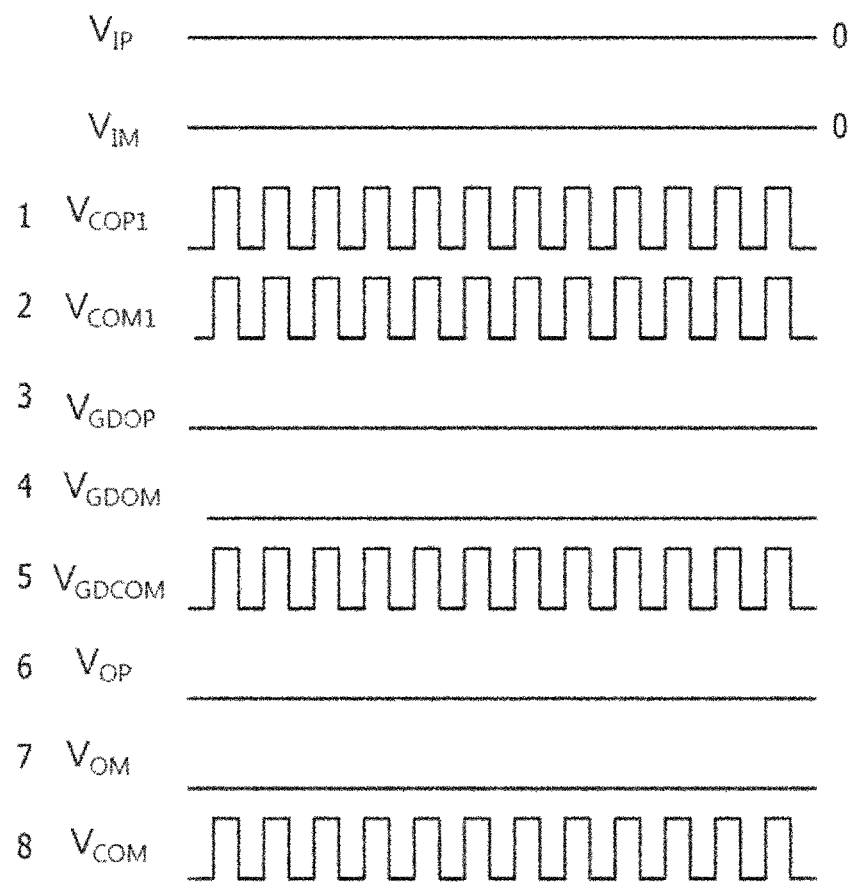
FIG. 4 is a waveform diagram showing output signals with respect to zero input signals of the modulation apparatus according to the embodiment of the present invention.

From Equation 2, for zero input signals, that is, a first input signal $V_{IP}$ and a second input signal $V_{IM}$ which are in a zero state, signals output from the respective components of FIG. 3 may be calculated, as shown in FIG. 4, and a first output signal $V_{OP}$ and a second output signal $V_{OM}$ are in a zero state in which Pulse Width Modulated (PWM) signals are not present. By way of this operation, power loss caused by the switching of the first gate driver 231a and the second gate driver 231b is eliminated, and EMI on the output lines is also reduced. Further, owing to a gate driver which uses a small delay cell 240 connected to the control signal $V_{GDCOM}$, the overall operation is identical to that of a conventional class D scheme.

Figure 5:
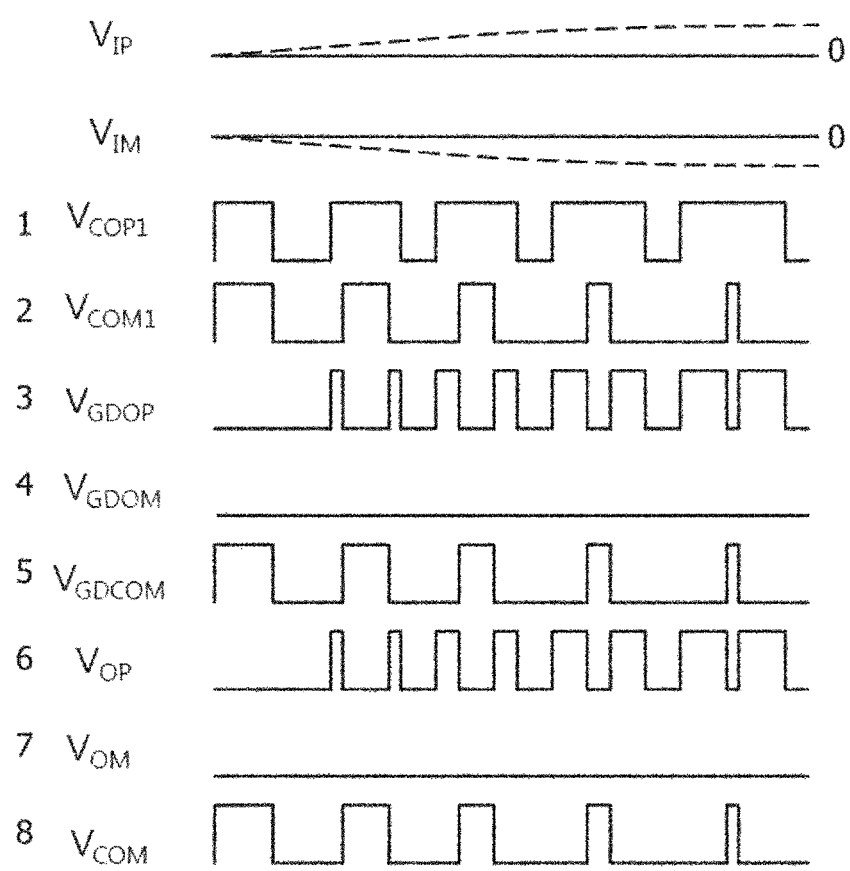
FIG. 5 is a waveform diagram showing exemplary input signals of the modulation apparatus according to the embodiment of the present invention.

FIG. 5 illustrates waveforms of respective signals in the case of non-zero input signals. As can be seen in FIG. 5 that, in the same manner, the first output signal $V_{OP}$ and the second output signal $V_{OM}$, and the first modulated signal $V_{COP1}$ and the second modulated signal $V_{COM1}$, are output as only signals from which the control signal $V_{GDCOM}$ that is the common signal component thereof is excluded, and thus a single output signal is generated. Similarly, the control signal $V_{GDCOM}$ is compensated for by the first integrator 211$a$ and the second integrator 211$b$ via feedback, and thus output having performance identical to that of the conventional modulation scheme may be generated.

Next, the amount of feedback is identical to that of the output signals generated from the output of conventional comparators 120$a$ and 120$b$, as given by the following Equation 3:

$$V_{FOP}=V_{OP}+V_{COM}=V_{COP1}$$

$$V_{FOM}=V_{OM}+V_{COM}=V_{COM1} \quad \text{Equation 3}$$

where $V_{FOP}$ denotes a feedback factor for the first integrator 211$a$, $V_{FOM}$ denotes a feedback factor for the second integrator 211$b$, and $V_{COM}$ denotes the common output signal.

As described above, in accordance with the modulation apparatus for the class D switching amplifier according to the preferred embodiment of the present invention, there can be provided a modulation apparatus for a class D switching amplifier, which not only can efficiently reduce EMI and power consumption by outputting zero state signals with respect to zero input signals, but also can be operated in the same manner as a conventional class D scheme when a normal signal is input.

What is claimed is:

1. A modulation apparatus for a class D switching amplifier, the modulation apparatus being a modulation apparatus for a switching amplifier outputting one or more output signals using a first input signal and a second input signal, comprising:
   a first modulation part for modulating the first input signal and outputting a first modulated signal;
   a second modulation part for modulating the second input signal and outputting a second modulated signal; and
   a control part for detecting and outputting a control signal that is a common signal component of the first modulated signal and the second modulated signal,
   wherein the control part further outputs: a first difference signal that is a difference signal between the first modulated signal and the control signal; and a second difference signal that is a difference signal between the second modulated signal and the control signal.

2. The modulation apparatus of claim 1, wherein a first output signal, a second output signal, and a common output signal that are output using the first modulated signal, the second modulated signal, and the control signal are fed back to input of the modulation apparatus.

3. The modulation apparatus of claim 1, further comprising:
   a power stage part for buffering and amplifying the first difference signal and the second difference signal and outputting a first output signal and a second output signal; and
   a delay cell part for buffering the control signal and outputting a common output signal.

4. The modulation apparatus of claim 3, wherein:
   the first output signal and the common output signal are fed back to input of the first modulation part, and
   the second output signal and the common output signal are fed back to input of the second modulation part.

5. The modulation apparatus of claim 3, wherein the power stage part comprises:
   a first gate driver for buffering the first difference signal and a first power transistor for amplifying a buffered signal; and
   a second gate driver for buffering the second difference signal and a second power transistor for amplifying a buffered signal.

6. The modulation apparatus of claim 1, wherein:
   the first modulation part comprises:
   a first integrator for receiving the first input signal, receiving some or all of one or more output signals via feedback, and integrating the received signals; and
   a first comparator for comparing an output signal of the first integrator with a reference signal and outputting the first modulated signal, and
   the second modulation part comprises:
   a second integrator for receiving the second input signal, receiving some or all of the one or more output signals via feedback, and integrating the received signals; and
   a second comparator for comparing an output signal of the second integrator with the reference signal and outputting the second modulated signal.

7. The modulation apparatus of claim 6, wherein:
   some or all of the one or more output signals that are fed back to input of the first integrator are signals generated based on the first modulated signal and the control signal, and
   some or all of the one or more output signals that are fed back to input of the second integrator are signals generated based on the second modulated signal and the control signal.

* * * * *